US010871511B1

(12) United States Patent
Hu (10) Patent No.: US 10,871,511 B1
(45) Date of Patent: Dec. 22, 2020

(54) ULTRA-WIDEBAND ORTHO-MODE TRANSDUCER WITH RIDGE

(71) Applicant: Nan Hu, Irvine, CA (US)

(72) Inventor: Nan Hu, Irvine, CA (US)

(73) Assignee: Nan Hu, Irvine, CA (US)

( * ) Notice: Subject to any disclaimer, the term of this patent is extended or adjusted under 35 U.S.C. 154(b) by 0 days.

(21) Appl. No.: 16/852,583

(22) Filed: Apr. 20, 2020

(51) Int. Cl.
*G01R 29/10* (2006.01)
*H04B 17/00* (2015.01)

(52) U.S. Cl.
CPC ......... *G01R 29/10* (2013.01); *H04B 17/0085* (2013.01)

(58) Field of Classification Search
CPC .......... H01P 1/171; H01P 1/161; H01P 1/165; H01P 1/2131; H01P 5/08; H04B 17/0085; G01R 29/10
USPC ......................................... 333/125
See application file for complete search history.

(56) References Cited

FOREIGN PATENT DOCUMENTS

WO WO-2019087166 A1 * 5/2019 ............ H01P 1/161

OTHER PUBLICATIONS

Jorge A. Ruiz-Cruz, Jose R. Montejo-Garai and Jesus M. Rebollar, "Full Wave Modeling and Optimization of Boifot Junction Ortho-Mode Transducers." International Journal of RF and Microwave Computer Aided Engineering, Jul. 2, 2008, pp. 303-313.*

* cited by examiner

*Primary Examiner* — Robert J Pascal
*Assistant Examiner* — Kimberly E Glenn
(74) *Attorney, Agent, or Firm* — Gang Yu (57) ABSTRACT

An ultra-wideband Ortho-Mode (OMT) Transducer with ridges is provided. The ultra-wideband OMT with ridges includes a mode separation cavity, a combining cavity and a matching cavity. The mode separation cavity is configured to separate waves transmitted by a common port into at least one TE01 mode and at least one TE10 mode. The combining cavity is connected to two side ports of the mode separation cavity, is configured to combine TE01 modes transmitted by the two side ports into one and output from a standard rectangular port. The matching cavity is connected to a through port of the mode separation cavity and is configured to smoothly transit at least one TE10 mode transmitted by the through port to the standard rectangular port for output. The ultra-wideband OMT with ridges further includes a first ridge, a second ridge, a third ridge, and a fourth ridge.

20 Claims, 9 Drawing Sheets

ULTRA-WIDEBAND ORTHO-MODE TRANSDUCER WITH RIDGE

TECHNICAL FIELD

The present disclosure relates to the technical field of broadband, and more particularly, to an ultra-wideband Ortho-Mode Transducer (OMT) with ridges.

BACKGROUND

As a fifth generation cell mobile communication system, it is characterized by high speed, low latency and dense connection. Compared with the previous generations communication systems, the frequency range used by the fifth generation communication system has significantly improved. During the research cycle of the 2019 World Infinite Telecommunication Conference, a new issue 1.13 was set up to look for available frequency bands above 6 GHz, and the research frequency range was 24.25-86 GHz.

That is, new requirements of 5G testing system are as follows: 1, a series of antennas suitable for various test methods is needed, 2, 5G millimeter wave frequency bands 24-50 GHz, 22.5-45 GHz need to be covered, 3, dual polarization, high cross-polarization (45 dB) and high port isolation (40 dB) are needed.

Similarly, for the new requirements of 5G testing system, the existing products have the following bottlenecks: 1, there is no 5G millimeter wave testing frequency band, 2, there is no standard waveguide to cover the 5G millimeter wave frequency band, 3, the cross-polarization of existing dual polarization antennas is specifically 30 dB and the port isolation is 20 dB, 4, due to frequency range spans octave ($2^1$) and multiple octave ($2^n$, n>1), it is difficult to achieve mode separation, high isolation and high polarization purity in this frequency range.

For the above technical problems, no solution has been obtained at present.

SUMMARY

The present disclosure provides an ultra-wideband Ortho-Mode Transducer (OMT) with ridges, intended to solve the problem in the conventional art that new requirements of 5G testing system cannot be met.

In order to solve the above problems, according to an aspect of the present disclosure, the present disclosure provides an ultra-wideband Ortho-Mode Transducer with ridges. The ultra-wideband Ortho-Mode Transducer with ridges includes a mode separation cavity, a combining cavity and a matching cavity. The mode separation cavity is configured to separate waves transmitted by a common port into at least one TE01 mode and at least one TE10 mode. The combining cavity is connected to two side ports of the mode separation cavity, and the combining cavity is configured to combine TE01 modes transmitted by the two side ports into one and output from a standard rectangular port. The matching cavity is connected to a through port of the mode separation cavity and is configured to smoothly transit at least one TE10 mode transmitted by the through port to the standard rectangular port for output. The ultra-wideband Ortho-Mode Transducer with ridges further includes four ridges which are a first ridge, a second ridge, a third ridge and a fourth ridge. The first ridge and the second ridge are located on a first side surface and a second side surface, and extend to the combining cavity, the first side surface and the second side surface are opposite surfaces of the mode separation cavity. The third ridge and the fourth ridge are located on a third side surface and a fourth side surface, the third side surface and the fourth side surface are opposite surfaces of the mode separation cavity.

Optionally, a first end of the first ridge, a first end of the second ridge, a first end of the third ridge and a first end of the fourth ridge are on a top surface penetrating the ultra wide ortho-mode transducer.

Optionally, a second end of the first ridge and a second end of the second ridge are smoothly transited to a planar state in the combining cavity.

Optionally, in a case that the second end of the first ridge and the second end of the second ridge are smoothly transited to the planar state in the combining cavity, a ridge height of the first ridge and a ridge height of the second ridge are gradually reduced until they are transited to the planar state.

Optionally, the combining cavity includes a combining chamber, a first conversion chamber and a second conversion chamber, a first end of the first conversion chamber and a first end of the second conversion chamber are connected to the two side ports of the mode separation cavity respectively, a second end of the first conversion chamber and a second end of the second conversion chamber are both connected to the combining chamber, the first conversion chamber and the second conversion chamber are configured to convert a single-ridge waveguide into a rectangular waveguide, and the combining chamber is configured to combine two rectangular waveguides into one rectangular waveguide.

Optionally, in a direction from the first end to the second end of the first conversion chamber, a ridged surface of the first conversion chamber is widened from a first preset position; and in a direction from the first end to the second end of the second conversion chamber, a ridged surface of the second conversion chamber is widened from a second preset position.

Optionally, in a direction from the first end to the second end of the third ridge and in a direction from the first end to the second end of the fourth ridge, a ridge height of the third ridge and a ridge height of the fourth ridge are gradually increased from a third preset position until a distance between the third ridge and the fourth ridge becomes a first threshold, the first threshold is a cross-sectional width of the through port of the mode separation cavity.

Optionally, in a direction from the first end to the second end of the third ridge and in a direction from the first end to the second end of the fourth ridge, a ridge width of the third ridge and a ridge width of the fourth ridge are gradually decreased from a fourth preset position until the ridge width of the third ridge becomes a second threshold and the ridge width of the fourth ridge becomes the second threshold.

Optionally, the two side ports are in an area of the mode separation cavity, and the distance between the third ridge and the fourth ridge is the first threshold in the area of the mode separation cavity.

Optionally, after the distance between the third ridge and the fourth ridge becomes the first threshold, ridge side walls of the third ridge are gradually separated at a preset angle until a distance between the ridge side walls of the third ridge becomes a third threshold; ridge side walls of the fourth ridge are gradually separated at the preset angle until a distance between the ridge side walls of the fourth ridge becomes the third threshold; and after the distance between the ridge side walls of the third ridge becomes the third threshold and the distance between the ridge side walls of the fourth ridge becomes the third threshold, the two ridge side walls of the third ridge and the two ridge side walls of the fourth ridge are combined in pairs and transformed into side walls of the two side ports of the mode separation cavity.

Optionally, the preset angle is 45°.

Optionally, after the distance between the third ridge and the fourth ridge becomes the first threshold, the first side surface and the second side surface of the mode separation cavity are turned at right angles to transform into side walls of the two side ports of the mode separation cavity, a longitudinal sections of the first side surface and a longitudinal sections of the second side surface are L-shaped.

Optionally, the matching cavity smoothly transits the through port of the mode separation cavity to the standard rectangular port based on a staircase structure, and a broadside size of each step in the staircase structure meets the Chebyshev impedance transformation.

Optionally, the matching cavity is turned at a right angle at a first position, and a stepped structure is arranged on the outside of the first position, the stepped structure is arranged along the turning width direction.

Optionally, cross-sectional dimensions of four ridges arranged on the ultra-wideband Ortho-Mode Transducer with ridges satisfy following formula:

$$f_c = \frac{1}{\pi\sqrt{\mu\varepsilon}\sqrt{\left(\frac{a_2}{b_2} + \frac{2C_f}{\varepsilon}\right)(a_1 - a_2)b_1}};$$

$$c_f = \frac{\varepsilon}{\pi}\left|\frac{T^2+1}{T}\ln\frac{1+T}{1-T} - 2\ln\frac{4T}{1-T^2}\right|;$$

$$T = \frac{b_2}{b_1};$$

and a1 is a long side length of the common port, a2 is a ridge width, b1 is a broadside length of the common port, b2 is a ridge pitch, u is a relative permeability, ε is a relative dielectric constant, fc is a cutoff frequency, and Cf is an edge capacitance.

Optionally, the ultra-wideband Ortho-Mode Transducer with ridges includes a plurality of components, the plurality of components form the mode separation cavity, the combining cavity and the matching cavity.

Optionally, the first ridge is arranged on one component of the plurality of components, and the second ridge is also arranged on one component of the plurality of components.

Optionally, the third ridge is arranged on one component of the plurality of components, and the fourth ridge is also arranged on one component of the plurality of components.

Optionally, the ultra-wideband Ortho-Mode Transducer with ridges includes at least three component groups which are stacked one after the other to form the mode separation cavity, the combining cavity and the matching cavity, the first ridge and the second ridge are arranged in a target component group, the target component group is a component group located in an intermediate position of the three component groups, and the target component group comprises at least two components.

Optionally, the target component group comprises a first component and a second component, the first component and the second component are arranged side by side, the first ridge is arranged on the first component, and the second ridge is arranged on the second component.

In present disclosure, the ultra-wideband Ortho-Mode Transducer with ridges broadens the bandwidth through a quad-ridged structure, which solves the technical problems that the existing products do not target a 5G millimeter wave test band, there is no standard waveguide to cover the 5G millimeter wave band, and the existing dual polarization is specifically cross polarization 30 dB and port isolation 20 dB. The ultra-wideband Ortho-Mode Transducer with ridges in present disclosure has the technical effects of a wider operating bandwidth, a higher port isolation and a higher cross polarization isolation compared to existing products.

BRIEF DESCRIPTION OF THE DRAWINGS

The attached drawings, which constitute a part of present disclosure, are used to provide a further understanding of the present disclosure, and the exemplary embodiments of the present disclosure and the description thereof are used to explain the present disclosure, but do not constitute improper limitations to the present disclosure. In the drawings.

The drawings include the following reference signs:

11, side port; 12, through port; 13, first ridge; 14, second ridge; 15, third ridge; 16, fourth ridge; 21, combining chamber; 22, first conversion chamber; 23, second conversion chamber; 31, stepped structure; 40, target component group; 41, first component; 42, second component; a, first preset position; b, second preset position; c, third preset position; d, fourth preset position.

DETAILED DESCRIPTION OF THE EMBODIMENTS

The technical solutions in the embodiments of the present disclosure will be clearly and completely described hereinbelow with the drawings in the embodiments of the present disclosure. It is apparent that the described embodiments are only part of the embodiments of the present disclosure, not all of the embodiments. The following description of at least one exemplary embodiment is only illustrative actually, and is not used as any limitation for the present disclosure and the disclosure or use thereof. On the basis of the embodiments of the present disclosure, all other embodiments obtained on the premise of no creative work of those of ordinary skill in the art should fall within the scope of protection of the present disclosure.

As shown in FIG. 1 to FIG. 4, some embodiments of the present disclosure provide an ultra-wideband Ortho-Mode Transducer (OMT) with ridges. The ultra-wideband Ortho-Mode Transducer with ridges includes a mode separation cavity, a combining cavity and a matching cavity. The mode separation cavity is configured to separate waves transmitted by a common port into at least one TE01 mode and at least one TE10 mode. The combining cavity is connected to two side ports of the mode separation cavity, and is configured to combine TE01 modes transmitted by the two side ports 11 into one and output from a standard rectangular port. The matching cavity is connected to a through port of the mode separation cavity and is configured to smoothly transit at least one TE10 mode transmitted by the through port to the standard rectangular port for output.

Figures 1, 2:
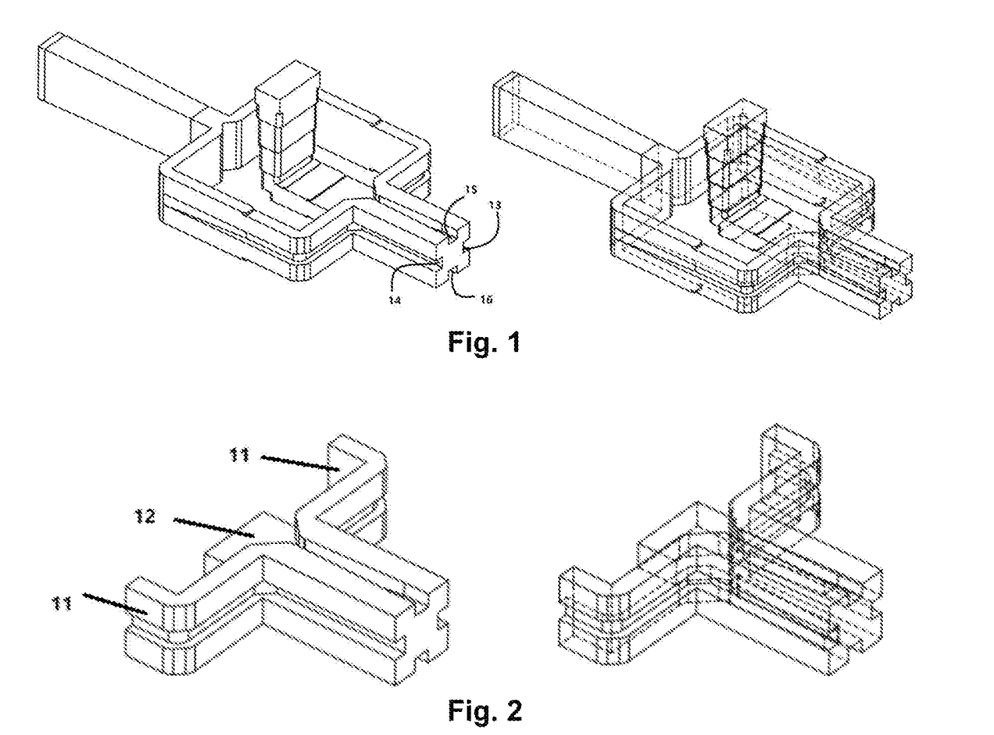
FIG. 1 illustrates a schematic structure diagram of an internal cavity of an ultra-wideband Ortho-Mode Transducer with ridges according to the present disclosure.
FIG. 2 illustrates a schematic structure diagram of a mode separation cavity of the ultra-wideband Ortho-Mode Transducer with ridges in FIG. 1.
Figure 3:
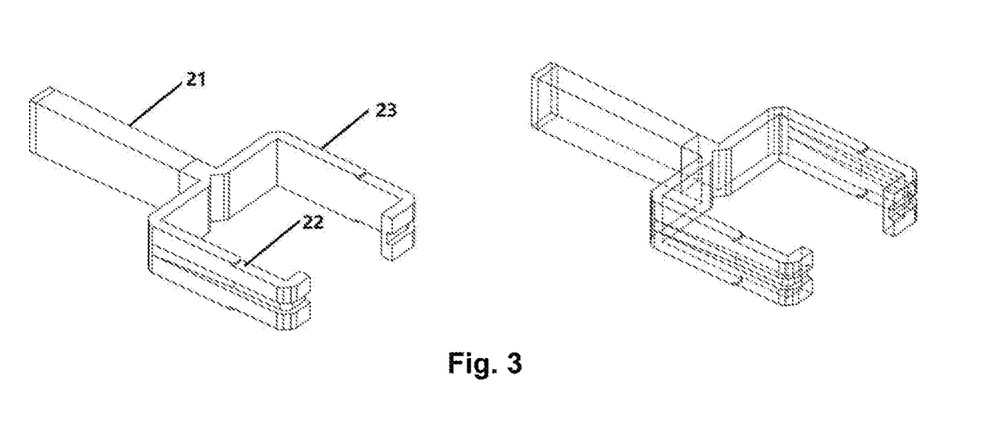
FIG. 3 illustrates a schematic structure diagram of a combining cavity of the ultra-wideband Ortho-Mode Transducer with ridges in FIG. 1.
Figure 4:
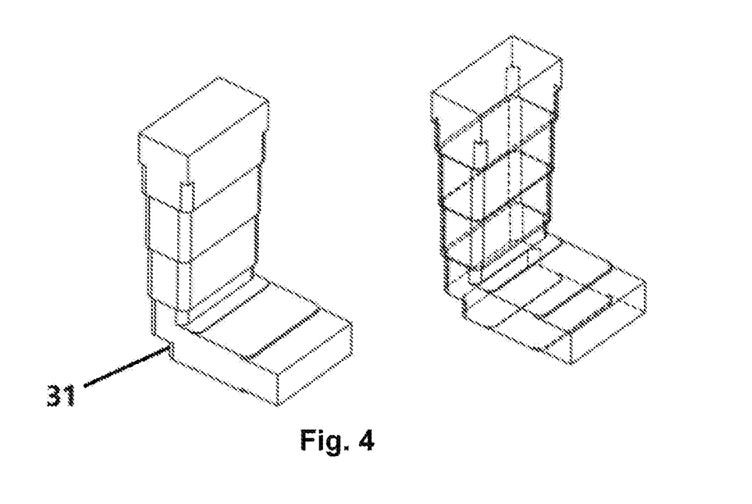
FIG. 4 illustrates a schematic structure diagram of a matching cavity of the ultra-wideband Ortho-Mode Transducer with ridges in FIG. 1.

In some embodiments, the ultra-wideband Ortho-Mode Transducer with ridges of present disclosure is shown in FIG. 1, the mode separation cavity is shown in FIG. 2, the combining cavity is shown in FIG. 3, and the matching cavity is shown in FIG. 4.

It is to be noted that the connection of the ultra-wideband Ortho-Mode Transducer with ridges to the outside in present disclosure involves three ports, that is, the common port (transmitting at least one TE01 mode and at least one TE10 mode), the standard rectangular port (transmitting a TE01 mode), and a standard rectangular port (transmitting at least one TE10 mode).

For the above three ports, for example, the ultra-wideband Ortho-Mode Transducer with ridges of present disclosure receives electromagnetic waves from the common port, and the electromagnetic waves are separated into at least one TE01 mode and at least one TE10 mode by the cavity structure of the mode separation cavity. The TE01 modes are transmitted to the combining cavity from the two side ports of the mode separation cavity, combined into one by the cavity structure of the combining cavity, and output from the standard rectangular port of the combining cavity. At least one TE10 mode is transmitted from the through port of the mode separation cavity to the matching cavity and output from the standard rectangular port of the matching cavity.

For the above three ports, for example, the ultra-wideband Ortho-Mode Transducer with ridges of present disclosure receives at least one TE01 mode from the standard rectangular port of the combining cavity, and divides at least one TE01 mode into two modes for transmission to the two side ports of the mode separation cavity. The wideband OMT of present disclosure receives at least one TE10 mode from the standard rectangular port of the matching cavity, and transmits at least one TE10 mode to the through port of the mode separation cavity. At this time, the mode separation cavity receives at least one TE01 mode from the two side ports, and receives at least one TE10 mode from the through port, and the mode separation cavity combines the received at least one TE01 mode and at least one TE10 mode into one and outputs from the common port.

In some embodiments, the common port is a square quad-ridged waveguide port with a side length of 5.9 mm, and is connected to a radiating antenna. The standard rectangular port is a BJ320 standard rectangular port, and is connected to a waveguide coaxial converter. The through port is a rectangular waveguide port of 6.6 mm*2.1 mm. Each of the two side port is a single-ridge waveguide port of 5.9 mm*1.56 mm.

The ultra-wideband Ortho-Mode Transducer with ridges includes four ridges which are a first ridge, a second ridge, a third ridge, and a fourth ridge, the first ridge and the second ridge are located on a first side surface and a second side which are opposite surfaces of the mode separation cavity, and extend to the combining cavity, and the third ridge and the fourth ridge are located on a third side surface and a fourth side surface which are opposite surfaces of the mode separation cavity.

In present disclosure, the ultra-wideband Ortho-Mode Transducer with ridges broadens the bandwidth through a quad-ridged structure, which solves the technical problems that the existing products do not target a 5G millimeter wave test band, there is no standard waveguide to cover the 5G millimeter wave band, and the existing dual polarization is specifically cross polarization 30 dB and port isolation 20 dB. The ultra-wideband Ortho-Mode Transducer with ridges in present disclosure has the technical effects of a wider operating bandwidth, a higher port isolation and a higher cross polarization isolation compared to existing products.

In an optional embodiment, a first end of the first ridge, a first end the second ridge, a first end the third ridge and a first end the fourth ridge are on a top surface penetrating the ultra wide ortho-mode transducer. That is, as shown in FIG. 1 and FIG. 2, cavity sides of the mode separation cavity are all with ridge waveguides, and the common port is also a quad-ridged port.

It is to be noted that the quad-ridged port does not exist in the conventional art, and obtained the following technical effects: the ultra-wideband Ortho-Mode Transducer with ridges of present disclosure has achieved a wider operating bandwidth compared to existing products.

In an optional embodiment, a second end of the first ridge and a second end of the second ridge are smoothly transited to a planar state in the combining cavity. That is, as shown in FIG. 1, FIG. 2 and FIG. 3, the first ridge and the second ridge respectively extend from the first side surface and the second side surface of the mode separation cavity to the Y-shaped combining cavity, and the second end of the first ridge and the second end of the second ridge are gradually transited to the planar state on the combining cavity.

Specifically, a ridge height of the first ridge and a ridge height of the second ridge are gradually reduced to achieve a technical effect of gradually transiting to a planar state on the combining cavity. That is, in a case that the second end of the first ridge and the second end of the second ridge are smoothly transited to the planar state in the combining cavity, the ridge height of the first ridge and the ridge height of the second ridge are gradually reduced until they are transited to the planar state.

In an optional embodiment, the combining cavity includes a combining chamber, a first conversion chamber and a second conversion chamber, a first end of the first conversion chamber and a first end of the second conversion chamber are connected to the two side ports of the mode separation cavity respectively, a second end of the first conversion chamber and a second end of the second conversion chamber are both connected to the combining chamber, the first conversion chamber and the second conversion chamber are configured to convert a single-ridge waveguide into a rectangular waveguide, and the combining chamber is configured to combine two rectangular waveguides into one rectangular waveguide.

That is, the first ridge and the second ridge are transited to the planar state in the first conversion cavity and the second conversion cavity of the combining cavity. At the same time, the first conversion cavity and the second conversion cavity are converted from the single-ridge waveguide to the rectangular waveguide, and then the two successfully converted rectangular waveguides are combined.

In an optional embodiment, in a direction from the first end to the second end of the first conversion chamber, a ridged surface of the first conversion chamber is widened from a first preset position; and in a direction from the first end to the second end of the second conversion chamber, a ridged surface of the second conversion chamber is widened from a second preset position.

As shown in FIG. 1 and FIG. 3, the surface of the first combining cavity with the first ridge is a surface A. and in a direction from the first end to the second end of the first conversion cavity, the surface A is widened from a first preset position.

It is to be noted that the first preset position is a starting position where the first ridge starts to transit to the planar state; the second preset position is a starting position where the second ridge starts to transit to the planar state; or, the first preset position is on a vertical portion of the first conversion cavity; the second preset position is on a vertical portion of the second conversion cavity.

Figure 5:
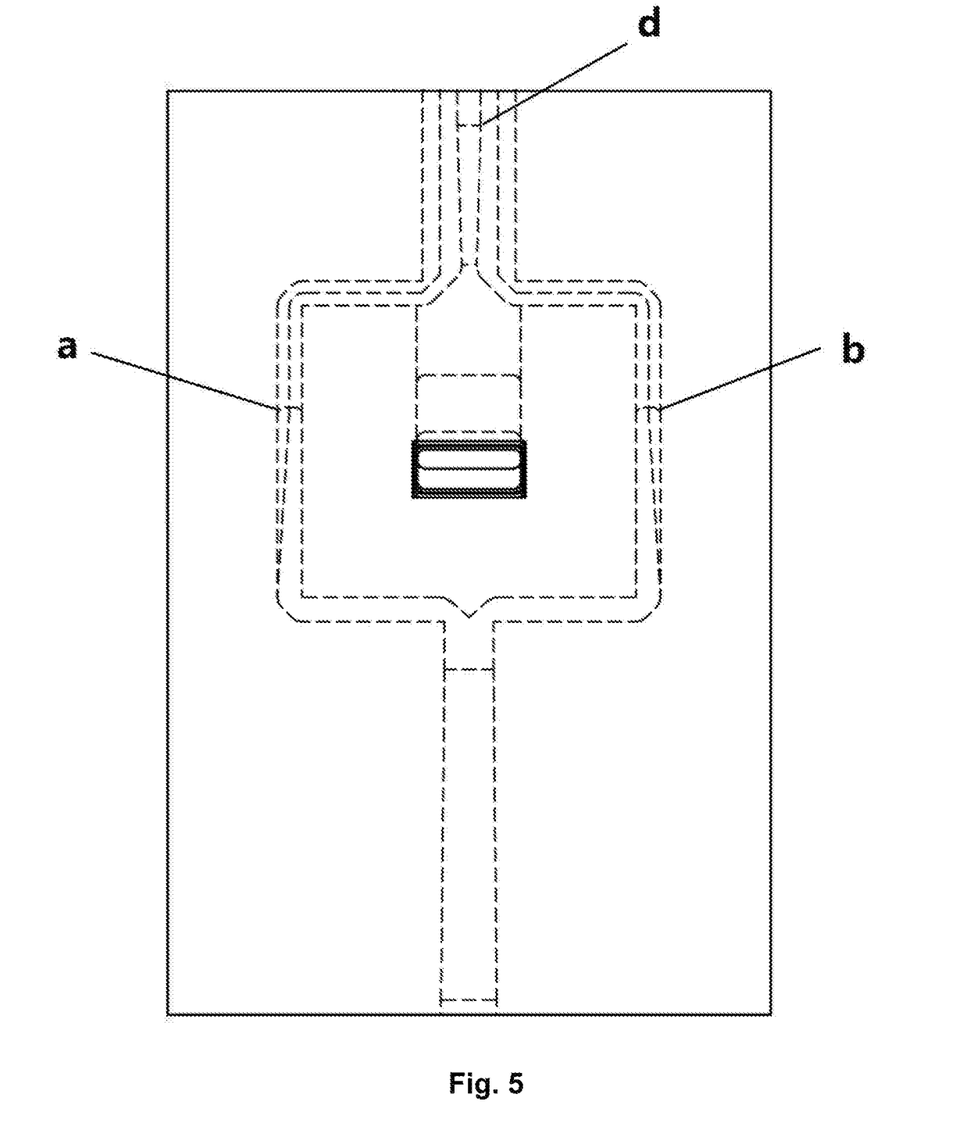
FIG. 5 illustrates a front perspective view of the ultra-wideband Ortho-Mode Transducer with ridges in FIG. 1.
Figure 6:
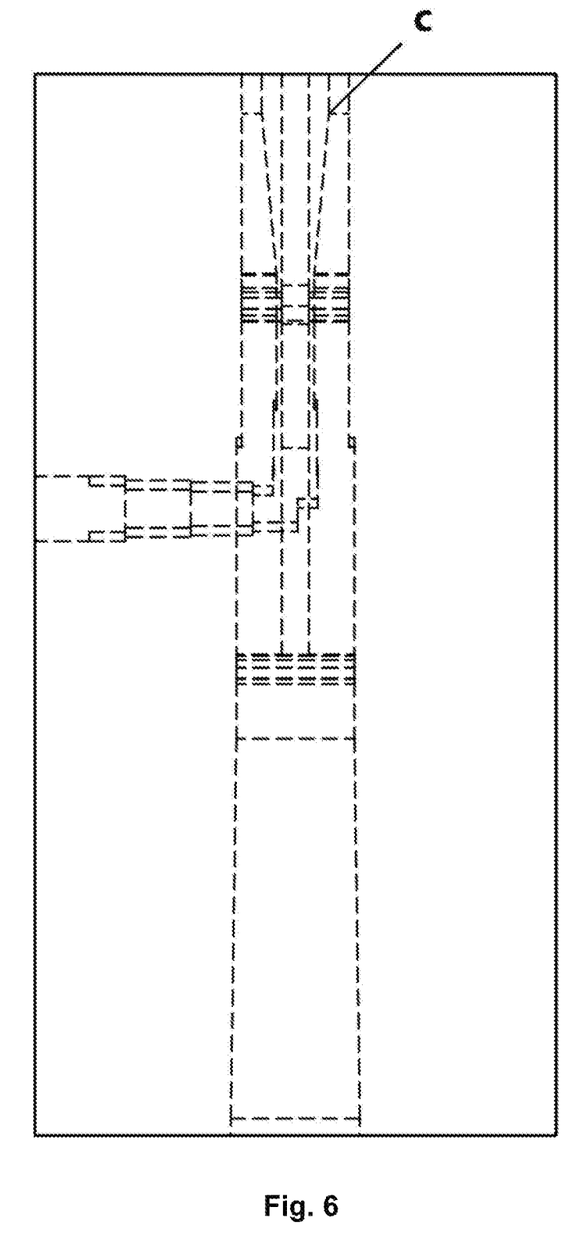
FIG. 6 illustrates a side perspective view of the ultra-wideband Ortho-Mode Transducer with ridges in FIG. 1.
Figure 7:
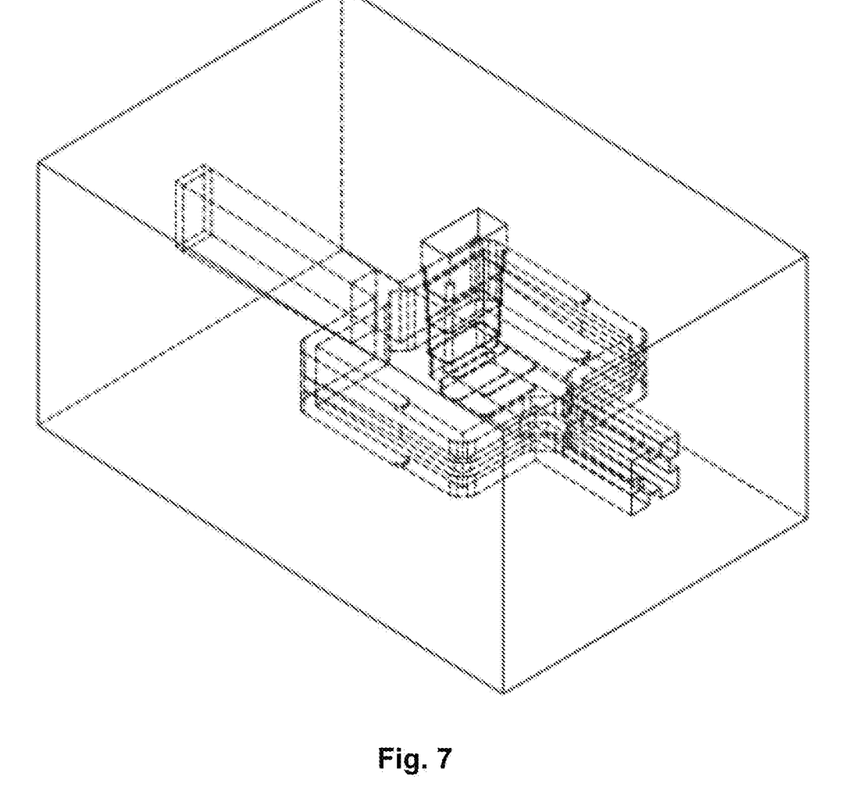
FIG. 7 illustrates a three-dimensional perspective view of the ultra-wideband Ortho-Mode Transducer with ridges in FIG. 1.

In an optional embodiment, the combining cavity is a T-shaped combining cavity, and a V-shaped ridge is arranged at a connection node of the T-shaped combining cavity. The V-shaped ridge is arranged along a depth direction to form a V-shaped gap of the combining cavity. The ridge surface angle of the V-shaped ridge is 45° as shown in FIG. 1 and FIG. 3. In addition, FIG. 5 is a front perspective view of the ultra-wideband Ortho-Mode Transducer with ridges, FIG. 6 is a side perspective view of the ultra-wideband Ortho-Mode Transducer with ridges, and FIG. 7 is a three-dimensional perspective view of the ultra-wideband Ortho-Mode Transducer with ridges. FIGS. 5, 6 and 7 also show corresponding V-shaped ridges arranged along the depth direction and the V-shaped gap of the combining cavity formed at the connection node.

In an optional embodiment, in a direction from the first ends to the second ends of the third ridge and the fourth ridge, a ridge height of the third ridge and a ridge height of the fourth ridge are gradually increased from a third preset position until a distance between the third ridge and the fourth ridge becomes a first threshold, the first threshold is a cross-sectional width of the through port of the mode separation cavity.

As shown in FIG. 1 and FIG. 2, the third ridge and the fourth ridge penetrate through a second surface and a third surface of the mode separation cavity, and gradually increase the ridge heights from the third preset position so that after the mode separation cavity subsequently separates the two side ports, the through port with the length greater than the width is naturally formed. FIG. 5 is a side perspective view of the ultra-wideband Ortho-Mode Transducer with ridges. Specifically, as shown in FIG. 5, the third ridge and the fourth ridge gradually increase the ridge heights from the third preset position, so as to gradually decrease the broadside size of the through port in the structure. The two modes outputting from the common port are separated at the junction of the side port and the through port.

In an optional embodiment, in a direction from the first ends to the second ends of the third ridge and the fourth ridge, the ridge widths of the third ridge and the fourth ridge are gradually decreased from a fourth preset position until the ridge width of the third ridge becomes the second threshold and the ridge width of the fourth ridge becomes the second threshold. The second threshold is related to a frequency band corresponding to the ultra-wideband Ortho-Mode Transducer with ridges. For example, as the frequency corresponding to the ultra-wideband Ortho-Mode Transducer with ridges is higher, the second threshold is greater.

It is to be noted that the third preset position and the fourth preset position can be the same position. That is, as shown in FIG. 1 and FIG. 2, when the third ridge and the fourth ridge begin to gradually increase the ridge heights, the third ridge and the fourth ridge also gradually decrease the ridge widths at the same time. Further, FIG. 5 is a front perspective view of the ultra-wideband Ortho-Mode Transducer with ridges, FIG. 6 is a side perspective view of the ultra-wideband Ortho-Mode Transducer with ridges, and FIG. 7 is a three-dimensional perspective view of the ultra-wideband Ortho-Mode Transducer with ridges. As shown in FIG. 5, FIG. 6 and FIG. 7, the third ridge and the fourth ridge gradually increase the ridge heights and decrease the ridge widths from the third preset position or the fourth preset position.

It is also to be noted that the ridge widths and ridge heights of the third ridge and the fourth ridge satisfy the preset conditions at the same time, and the ridge widths and ridge heights of the third ridge and the fourth ridge no longer change. Specifically, as shown in FIG. 5, FIG. 6 and FIG. 7, the third ridge and the fourth ridge gradually increase the ridge heights and gradually reduce the ridge widths from the third preset position. Further, the ridge heights of the third ridge and the fourth ridge satisfy the preset conditions and no more increase, and the ridge widths of the third ridge and the fourth ridge gradually satisfy the preset conditions and no longer decrease. At this time, the ridge widths and ridge heights of the third ridge and the fourth ridge satisfy the preset conditions and no longer change at the same position.

In an optional embodiment, after a distance between the third ridge and the fourth ridge becomes the first threshold, the mode separation cavity begins to form two side ports.

Specifically, after the distance between the third ridge and the fourth ridge becomes the first threshold, ridge side walls of the third ridge are gradually separated at a preset angle until a distance between the ridge side walls of the third ridge becomes a third threshold; ridge side walls of the fourth ridge are gradually separated at the preset angle until a distance between the ridge side walls of the fourth ridge becomes the third threshold; and after the distance between the ridge side walls of the third ridge becomes the third threshold and the distance between the ridge side walls of the fourth ridge becomes the third threshold, the two ridge side walls of the third ridge and the two ridge side walls of the fourth ridge are combined in pairs and transformed into side walls of the two side ports of the mode separation cavity. The preset angle is 45°.

That is, as shown in FIG. 1, FIG. 2 and FIG. 5, the ridge side walls of the third ridge are gradually separated until they become part of the side walls of the two side ports of the mode separation cavity, and the ridge side walls of the fourth ridge are gradually separated until they become part of the side walls of the two side ports of the mode separation cavity. The ridge side walls of the third ridge are the first ridge side wall and the second ridge side wall respectively, and the ridge side walls of the fourth ridge are the third ridge side wall and the fourth ridge side wall respectively. The first ridge side wall and the third ridge side wall are joined together from the side surfaces of the through port to form a side wall of a side port. The second ridge side wall and the fourth ridge side wall are joined together from the side surfaces of the through port to form a side wall of the other side port.

It is to be noted that in present disclosure, the ridge side walls of the third ridge are gradually separated at the preset angle, the ridge side walls of the fourth ridge are gradually separated at the preset angle, and the preset angle is 45 degrees. That is, the ridge side wall are separated in a linear transition mode, rather than separated in a curved transition mode, and a separation angle of the linear transition mode is 45°. It is to be noted that the quad-ridged port does not exist in the conventional art, and the quad-ridged port has obtained the following technical effects: the ultra-wideband Ortho-Mode Transducer with ridges of present disclosure has achieved a wider operating bandwidth compared to existing products.

It is also to be noted that in present disclosure, the two ridge side walls of the third ridge and the two ridge side walls of the fourth ridge are combined in pairs after the distance between the ridge side walls of the third ridge becomes the third threshold and the distance between the ridge side walls of the fourth ridge becomes the third threshold, and converted into the side walls of two side ports of the mode separation cavity. That is, in an optional embodiment, the two ridge side walls of the third ridge and the two ridge side walls of the fourth ridge can be combined in pairs after a preset length and after the distance between the ridge side walls of the third ridge becomes the third threshold and the distance between the ridge side walls of the fourth ridge becomes the third threshold, and converted into the side walls of two side ports of the mode separation cavity. In another optional embodiment, the two ridge side walls of the third ridge and the two ridge side walls of the fourth ridge can be combined in pairs immediately after the distance between the ridge side walls of the third ridge becomes the third threshold and the distance between the ridge side walls of the fourth ridge becomes the third threshold, and converted into the side walls of two side ports of the mode separation cavity.

Specifically, after the distance between the third ridge and the fourth ridge becomes the first threshold, the first side surface and the second side surface of the mode separation cavity are turned at right angles to transform into side walls of the two side ports of the mode separation cavity. That is, the longitudinal sections of the first side surface and the second side surface are L-shaped as shown in FIG. 5.

It is to be noted that after the distance between the third ridge and the fourth ridge becomes the first threshold in present disclosure, the first side surface and the second side surface of the mode separation cavity begin to be turned at right angles. The first side surface and the second side surface of the mode separation cavity can be turned at right angles after a preset length, so that a width and a length of the cross section of the side port after turning satisfy second preset conditions. For example, the width of the cross section of the side surface after conversion is 1.56 mm, and the length of the cross section of the side surface after conversion is 5.9 mm.

In an optional embodiment, the matching cavity smoothly transits the through port of the mode separation cavity to the standard rectangular port based on a staircase structure, and a broadside size of each step in the staircase structure meets the Chebyshev impedance transformation. In addition, the matching cavity is turned at a right angle at a first position, and a stepped structure is arranged laterally outside the turning point, the stepped structure is arranged along the turning width direction. That is, the stepped structure is shown in FIG. 4 so that the matching cavity achieves a step turn in the first position.

It is to be noted that the matching cavity is turned at a right angle at the first position, and the stepped structure is arranged laterally outside the turning point, as shown in FIG. 4 and FIG. 6. The technical feature achieves the technical effect of increasing the bandwidth of the ultra-wideband Ortho-Mode Transducer with ridges.

Figure 8:
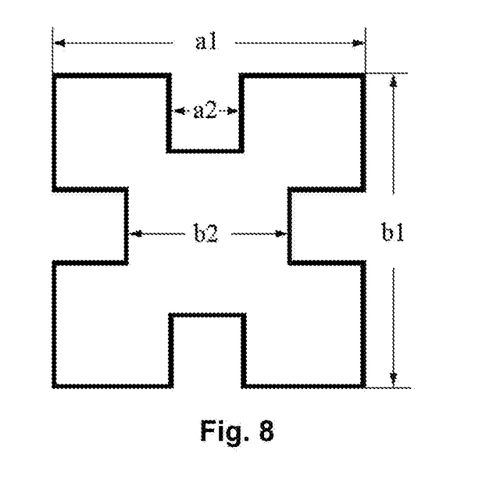
FIG. 8 illustrates a schematic diagram of a size symbol of a common port of the ultra-wideband Ortho-Mode Transducer with ridges in FIG. 1.

In addition, it is also to be noted that cross-sectional dimensions of four ridges arranged on the ultra-wideband Ortho-Mode Transducer with ridges satisfy the following formula:

$$f_c = \frac{1}{\pi\sqrt{\mu\varepsilon}\sqrt{\left(\frac{a_2}{b_2} + \frac{2C_f}{\varepsilon}\right)(a_1 - a_2)b_1}};$$

$$c_f = \frac{\varepsilon}{\pi}\left|\frac{T^2+1}{T}\ln\frac{1+T}{1-T} - 2\ln\frac{4T}{1-T^2}\right|;$$

$$T = \frac{b_2}{b_1};$$

and $a_1$ is a long side length of the common port, $a_2$ is a ridge width, $b_1$ is a broadside length of the common port, $b_2$ is a ridge pitch, u is a relative permeability, $\varepsilon$ is a relative dielectric constant, $f_c$ is a cutoff frequency, and $C_f$ is an edge capacitance, as shown in FIG. 8.

That is, the ultra-wideband Ortho-Mode Transducer with ridges described in present disclosure can calculate the cut-off frequencies of quad-ridged waveguides of different sizes by the above formula.

In summary, the present disclosure adopts a quad-ridge structure for the common port in an OMT, and adopts a full-ridge waveguide design at a mode separation part. Further, the double-ridge waveguide is transited to a non-standard rectangular waveguide near the through port, and the non-standard rectangular waveguide is transited to an international standard rectangular waveguide through step impedance matching. Each of two branch side ports is transited from a single-ridge waveguide to the non-standard rectangular waveguide. The above quad-ridged structure has a wider operating bandwidth and a higher port isolation, realizes multiple octave, has a good impedance matching, a higher isolation and a higher polarization purity, and reduces processing difficulty.

This disclosure also provides some other optional embodiments. The ultra-wideband Ortho-Mode Transducer with ridges model includes a plurality of components, and the plurality of components form the mode separation cavity, the combining cavity and the matching cavity In an optional embodiment, the first ridge is arranged on one component of the plurality of components, and the second ridge is also arranged on one component of the plurality of components.

That is, in the embodiment, the first ridge and the second ridge can be completely arranged on a certain component, instead of being spliced by multiple components. It is to be noted that the first ridge and the second ridge can be completely arranged on the same component, or can be completely arranged on different components, which is not specifically limited in present disclosure.

In an optional embodiment, the third ridge is arranged on one component of the plurality of components, and the fourth ridge is also arranged on one component of the plurality of components.

That is, in the embodiment, the third ridge and the fourth ridge can be completely arranged on a certain component, instead of being spliced by multiple components. It is to be noted that the third ridge and the fourth ridge can be completely arranged on the same component, or can be completely arranged on different components, which is not specifically limited in present disclosure.

Figure 9:
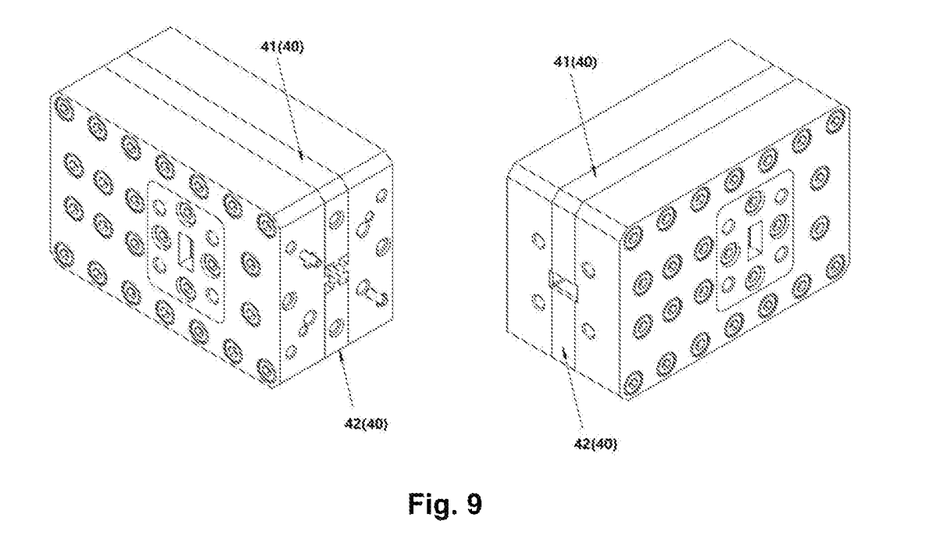
FIG. 9 illustrates a disassembly structure diagram 1 of the ultra-wideband Ortho-Mode Transducer with ridges according to the present disclosure.
Figure 10:
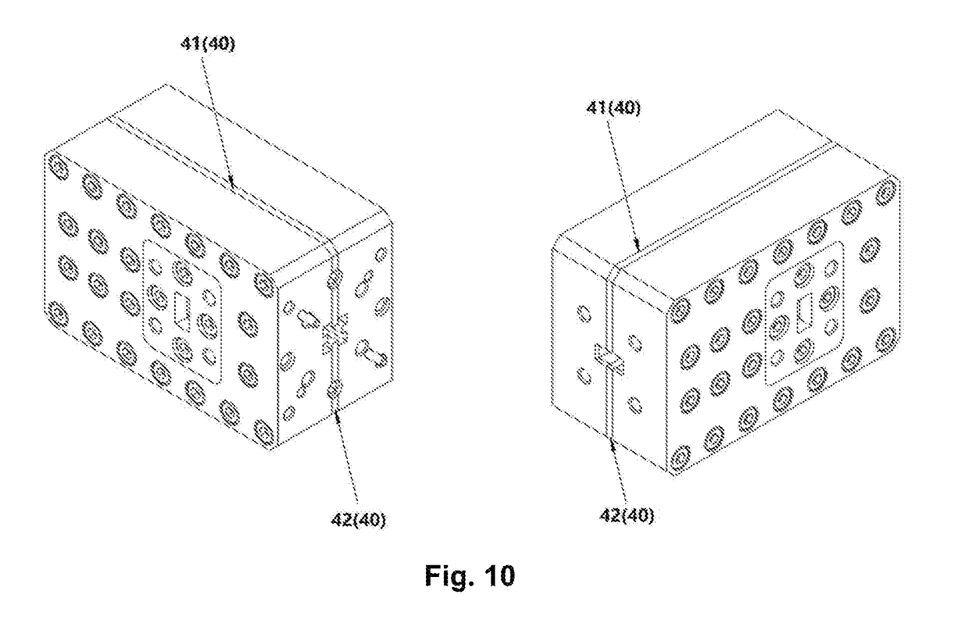
FIG. 10 illustrates a disassembly structure diagram 2 of the ultra-wideband Ortho-Mode Transducer with ridges according to the present disclosure.
Figure 11:
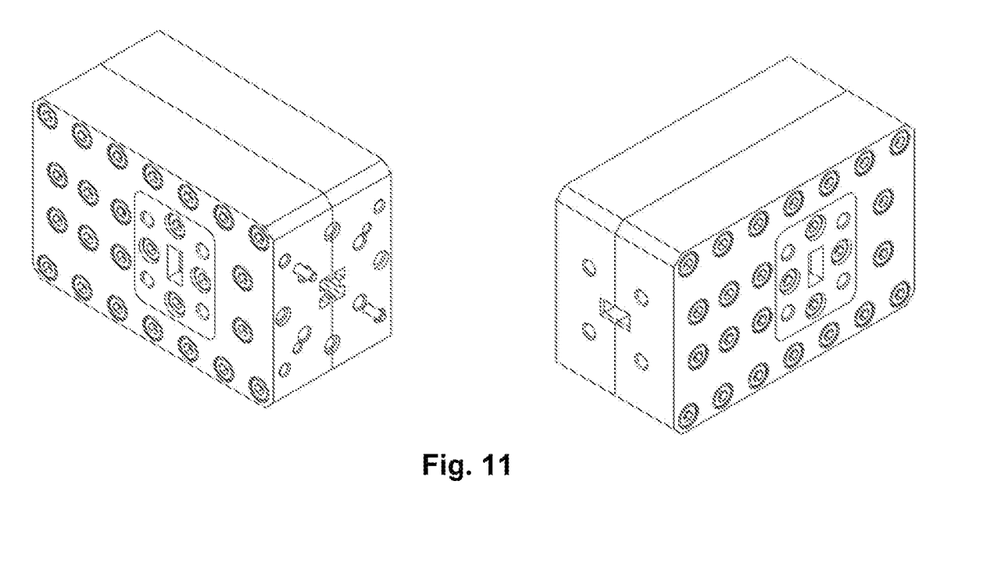
FIG. 11 illustrates a disassembly structure diagram 3 of the ultra-wideband Ortho-Mode Transducer with ridges according to the present disclosure.

For example, as shown in FIG. 9 and FIG. 10, the ultra-wideband Ortho-Mode Transducer with ridges is provided with three component groups which are stacked on after the other to form the mode separation cavity, the combining cavity and the matching cavity. The first ridge and the second ridge are completely arranged in a target component group, and the target component group is a component group located in an intermediate position of the three component groups. This arrangement manner prevents combination gaps between the components from being arranged on the ridge, resulting in the situation that the gaps on the ridge cannot be effectively combined and sealed. Specifically, as shown in FIG. 11, if the combined gap between the components is arranged on the ridge, based on the internal cavity structure of the ultra-wideband Ortho-Mode Transducer with ridges, it will not be possible to provide screw fastening members at the ridge, resulting in that the gaps on the ridge cannot be effectively combined and sealed, which affects reduction of the operating stability of the ultra-wideband Ortho-Mode Transducer with ridges.

Figure 12:
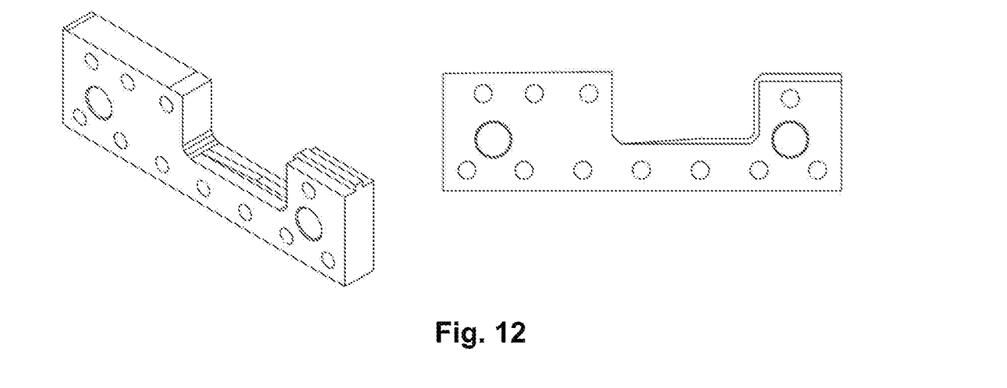
FIG. 12 illustrates a schematic structure diagram of a target component group in the ultra-wideband Ortho-Mode Transducer with ridges according to the present disclosure.

It is to be noted that the target component group includes two components side by side, which are a first component and a second component. The first ridge is arranged on the first component, and the second ridge is arranged on the second component, as shown in FIG. 12. In addition, the width of the target component group in the stacked direction can be the ridge height, or the width of the first/second side surface, or any value between the ridge height value and the width value of the first/second side surface, which is not specifically limited in present disclosure.

Figure 13:
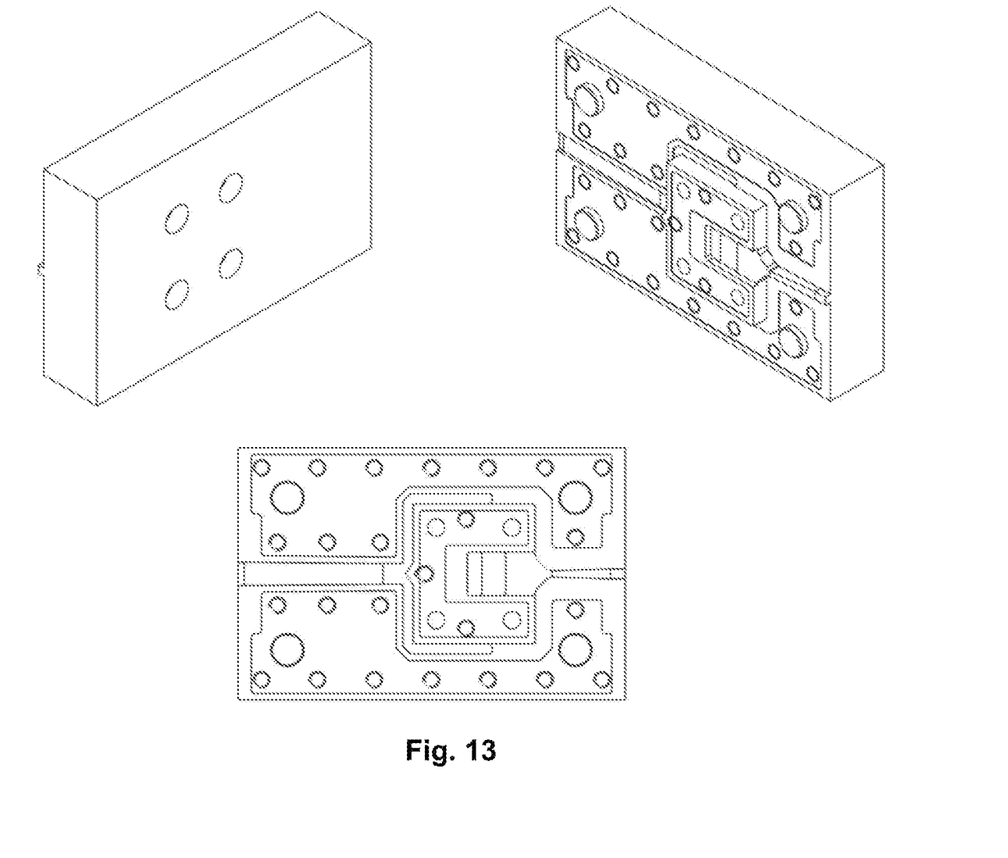
FIG. 13 illustrates a schematic structure diagram of a first component group in the ultra-wideband Ortho-Mode Transducer with ridges according to the present disclosure.
Figure 14:
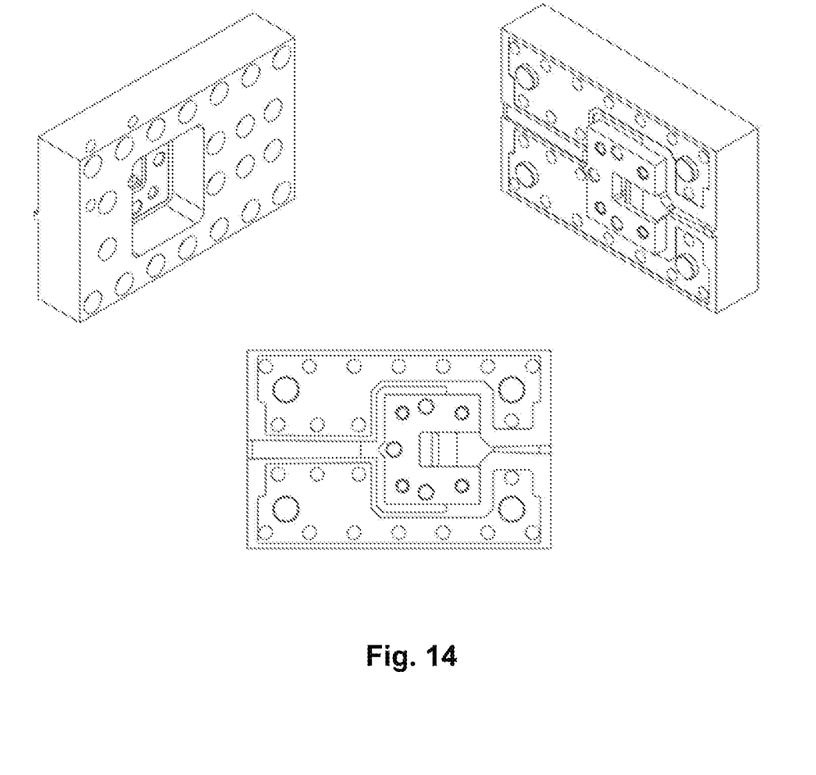
FIG. 14 illustrates a schematic structure diagram of a second component group in the ultra-wideband Ortho-Mode Transducer with ridges according to the present disclosure.

It is to be noted that in addition to the target component group, the three component groups further include a first component group and a second component group. As shown in FIG. 12, FIG. 13 and FIG. 14, the target component group, the first component group and the second component group are correspondingly provided with multiple screw fastening members. The multiple screw fastening members are configured to connect the first component group, the second component group and the target component group, so as to avoid the situation that the operating stability of the ultra-wideband Ortho-Mode Transducer with ridges is affected due to a gap in the cavity.

The above is only the preferred embodiments of the present disclosure, not intended to limit the present disclosure. As will occur to those skilled in the art, the present disclosure is susceptible to various modifications and changes. Any modifications, equivalent replacements, improvements and the like made within the spirit and principle of the present disclosure shall fall within the scope of protection of the present disclosure.

It is to be noted that terms used herein only aim to describe specific implementation manners, and are not intended to limit exemplar implementations of present disclosure. Unless otherwise directed by the context, singular forms of terms used herein are intended to include plural forms. Besides, it will be also appreciated that when terms "contain" and/or "include" are used in the description, it is indicated that features, steps, operations, devices, assemblies and/or a combination thereof exist.

Unless otherwise specified, relative arrangements of components and steps elaborated in these embodiments, numeric expressions and numeric values do not limit the scope of the present disclosure. Furthermore, it should be understood that for ease of descriptions, the size of each part shown in the drawings is not drawn in accordance with an actual proportional relation. Technologies, methods and devices known by those skilled in the related art may not be discussed in detail. However, where appropriate, the technologies, the methods and the devices shall be regarded as part of the authorized description. In all examples shown and discussed herein, any specific values shall be interpreted as only exemplar values instead of limited values. As a result, other examples of the exemplar embodiments may have different values. It is to be noted that similar marks and letters represent similar items in the following drawings. As a result, once a certain item is defined in one drawing, it is unnecessary to further discuss the certain item in the subsequent drawings.

In the descriptions of the present disclosure, it will be appreciated that locative or positional relations indicated by "front, back, up, down, left, and right", "horizontal, vertical, perpendicular, and horizontal", "top and bottom" and other terms are locative or positional relations shown on the basis of the drawings, which are only intended to make it convenient to describe the present disclosure and to simplify the descriptions without indicating or impliedly indicating that the referring device or element must have a specific location and must be constructed and operated with the specific location, and accordingly it cannot be understood as limitations to the present disclosure. The nouns of locality "inner and outer" refer to the inner and outer contours of each component.

For ease of description, spatial relative terms such as "over", "above", "on an upper surface" and "upper" may be used herein for describing a spatial position relation between a device or feature and other devices or features shown in the drawings. It will be appreciated that the spatial relative terms aim to contain different orientations in usage or operation besides the orientations of the devices described in the drawings. For example, if the devices in the drawings are inverted, devices described as "above other devices or structures" or "over other devices or structures" will be located as "below other devices or structures" or "under other devices or structures". Thus, an exemplar term "above" may include two orientations namely "above" and "below". The device may be located in other different modes (rotated by 90 degrees or located in other orientations), and spatial relative descriptions used herein are correspondingly explained.

In addition, it is to be noted that terms "first", "second" and the like are used to limit parts, and are only intended to distinguish corresponding parts. If there are no otherwise statements, the above terms do not have special meanings, such that they cannot be understood as limits to the scope of protection of the present disclosure.

What is claimed is:

1. An ultra-wideband Ortho-Mode Transducer (OMT) with ridges, comprising a mode separation cavity, a combining cavity and a matching cavity, wherein the mode separation cavity is configured to separate waves transmitted by a common port into at least one TE01 mode and at least one TE10 mode, the combining cavity is connected to two side ports of the mode separation cavity, and the combining cavity is configured to combine at least one TE01 mode transmitted by the two side ports into one and output from a standard rectangular port, and the matching cavity is connected to a through port of the mode separation cavity and is configured to smoothly transit the at least one TE10 mode transmitted by the through port to the standard rectangular port for output; and the ultra wide ortho-mode transducer further comprises four ridges, which are a first ridge, a second ridge, a third ridge and a fourth ridge, the first ridge and the second ridge are located on a first side surface and a second side surface, and extend to the combining cavity, the first side surface and the second side surface are opposite surfaces of the mode separation cavity, and the third ridge and the fourth ridge are located on a third side surface and a fourth side surface, and the third side surface and the fourth side surface are opposite surfaces of the mode separation cavity.

2. The ultra-wideband Ortho-Mode Transducer with ridges as claimed in claim 1, wherein a first end of the first ridge, a first end of the second ridge, a first end of the third ridge and a first end of the fourth ridge are on a top surface penetrating the ultra wide ortho-mode transducer.

3. The ultra-wideband Ortho-Mode Transducer with ridges as claimed in claim 2, wherein a second end of the first ridge and a second end of the second ridge are smoothly transited to a planar state in the combining cavity.

4. The ultra-wideband Ortho-Mode Transducer with ridges as claimed in claim 3, wherein in a case that the second end of the first ridge and the second end of the second ridge are smoothly transited to the planar state in the combining cavity, a ridge height of the first ridge and a ridge height of the second ridge are gradually reduced until the first ridge and the second ridge are transited to the planar state.

5. The ultra-wideband Ortho-Mode Transducer with ridges as claimed in claim 2, wherein in a direction from the first end to a second end of the third ridge and in a direction from the first end to a second end of the fourth ridge, a ridge height of the third ridge and a ridge height of the fourth ridge are gradually increased from a third preset position (c) until a distance between the third ridge and the fourth ridge becomes a first threshold, wherein the first threshold is a cross-sectional width of the through port of the mode separation cavity.

6. The ultra-wideband Ortho-Mode Transducer with ridges as claimed in claim 5, wherein the two side ports (11) are in an area of the mode separation cavity, and the distance between the third ridge (15) and the fourth ridge (16) is the first threshold in the area of the mode separation cavity.

7. The ultra-wideband Ortho-Mode Transducer with ridges as claimed in claim 6, wherein after the distance between the third ridge and the fourth ridge becomes the first threshold, the first side surface and the second side surface of the mode separation cavity are turned at right angles to transform into side walls of the two side ports of the mode separation cavity, a longitudinal section of the first side surface and a longitudinal section of the second side surface are L-shaped.

8. The ultra-wideband Ortho-Mode Transducer with ridges as claimed in claim 6, wherein after the distance between the third ridge and the fourth ridge becomes the first threshold, ridge side walls of the third ridge are gradually separated at a preset angle until a distance between the ridge side walls of the third ridge becomes a third threshold; ridge side walls of the fourth ridge are gradually separated at the preset angle until the distance between the ridge side walls of the fourth ridge becomes the third threshold; and after the distance between the ridge side walls of the third ridge becomes the third threshold and the distance between the ridge side walls of the fourth ridge becomes the third threshold, the two ridge side walls of the third ridge and the two ridge side walls of the fourth ridge are combined in pairs and transformed into side walls of the two side ports of the mode separation cavity.

9. The ultra-wideband Ortho-Mode Transducer with ridges as claimed in claim 8, wherein the preset angle is 45°.

10. The ultra-wideband Ortho-Mode Transducer with ridges as claimed in claim 2, wherein in a direction from the first end to a second end of the third ridge and in a direction from the first end to a second end of the fourth ridge, a ridge width of the third ridge and a ridge width of the fourth ridge are gradually decreased from a fourth preset position (d) until the ridge width of the third ridge becomes a second threshold and the ridge width of the fourth ridge becomes the second threshold.

11. The ultra-wideband Ortho-Mode Transducer with ridges as claimed in claim 1, wherein the combining cavity comprises a combining chamber, a first conversion chamber and a second conversion chamber, a first end of the first conversion chamber and a first end of the second conversion chamber are connected to the two side ports of the mode separation cavity respectively, a second end of the first conversion chamber and a second end of the second conversion chamber are both connected to the combining chamber, the first conversion chamber and the second conversion chamber are configured to convert a single-ridge waveguide into a rectangular waveguide, and the combining chamber is configured to combine two rectangular waveguides into one rectangular waveguide.

12. The ultra-wideband Ortho-Mode Transducer with ridges as claimed in claim 11, wherein in a direction from the first end to the second end of the first conversion chamber, a ridged surface of the first conversion chamber is widened from a first preset position (a); and in a direction from the first end to the second end of the second conversion chamber, a ridged surface of the second conversion chamber is widened from a second preset position (b).

13. The ultra-wideband Ortho-Mode Transducer with ridges as claimed in claim 1, wherein the matching cavity smoothly transits the through port of the mode separation cavity to the standard rectangular port based on a staircase structure, and a broadside size of each step in the staircase structure meets the Chebyshev impedance transformation.

14. The ultra-wideband Ortho-Mode Transducer with ridges as claimed in claim 13, wherein the matching cavity is turned at a right angle at a first position, and a stepped structure is arranged on the outside of the first position.

15. The ultra-wideband Ortho-Mode Transducer with ridges as claimed in claim 1, wherein cross-sectional dimensions of the four ridges arranged on the ultra wide ortho-mode transducer satisfy following formula:

$$f_c = \frac{1}{\pi\sqrt{\mu\varepsilon}\sqrt{\left(\frac{a_2}{b_2} + \frac{2C_f}{\varepsilon}\right)(a_1 - a_2)b_1}};$$

-continued $$c_f = \frac{\varepsilon}{\pi}\left|\frac{T^2+1}{T}\ln\frac{1+T}{1-T} - 2\ln\frac{4T}{1-T^2}\right|;$$

$$T = \frac{b_2}{b_1};$$

and $a_1$ is a long side length of the common port, $a_2$ is a ridge width, $b_1$ is a broadside length of the common port, $b_2$ is a ridge pitch, u is a relative permeability, ε is a relative dielectric constant, fc is a cutoff frequency, and Cf is an edge capacitance.

16. The ultra-wideband Ortho-Mode Transducer with ridges as claimed in claim 1, the ultra-wideband Ortho-Mode Transducer with ridges comprising a plurality of components, wherein the plurality of components form the mode separation cavity, the combining cavity and the matching cavity.

17. The ultra-wideband Ortho-Mode Transducer with ridges as claimed in claim 16, the first ridge is arranged on one component of the plurality of components, and the second ridge is also arranged on one component of the plurality of components.

18. The ultra-wideband Ortho-Mode Transducer with ridges as claimed in claim 17, wherein the ultra-wideband Ortho-Mode Transducer with ridges comprises at least three component groups which are stacked one after the other to form the mode separation cavity, the combining cavity and the matching cavity, wherein the first ridge and the second ridge are arranged in a target component group, the target component group is a component group located in an intermediate position of the three component groups, and the target component group comprises at least two components.

19. The ultra-wideband Ortho-Mode Transducer with ridges as claimed in claim 18, wherein the target component group comprises a first component and a second component, the first component and the second component are arranged side by side, wherein the first ridge is arranged on the first component, and the second ridge is arranged on the second component.

20. The ultra-wideband Ortho-Mode Transducer with ridges as claimed in claim 16, wherein the third ridge is arranged on one component of the plurality of components, and the fourth ridge is also arranged on one component of the plurality of components.

* * * * *